(12) United States Patent
Yan

(10) Patent No.: US 6,278,557 B1
(45) Date of Patent: *Aug. 21, 2001

(54) METHOD AND APPARATUS FOR STACKING BEAMS

(75) Inventor: Yu Yan, Binghamton, NY (US)

(73) Assignee: Semiconductor Laser International Corporation, Binghamton, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/257,539

(22) Filed: Feb. 24, 1999

(51) Int. Cl.[7] .................. G02B 27/14; G02B 27/12; G02B 15/14
(52) U.S. Cl. .................. 359/638; 359/640; 359/678
(58) Field of Search .................. 359/638, 639, 359/640, 641, 853

(56) References Cited

U.S. PATENT DOCUMENTS 5,339,186 * 8/1994 Weverka .................. 359/140

FOREIGN PATENT DOCUMENTS

PCT/GB94/02614 * 11/1994 (WO).

* cited by examiner

*Primary Examiner*—Georgia Epps
*Assistant Examiner*—Saud Seyrafi
(74) *Attorney, Agent, or Firm*—Hugh D. Jaeger

(57) ABSTRACT

Methods and apparatus for reconfiguring a generally elliptically shaped beam produced by a laser diode bar into a single modified beam of substantially symmetrical shape. The methods and apparatus include the provision and utilization of a prism assembly which includes an entrance aperture, an exit aperture, and four total internal reflection surfaces. An incident beam is totally reflected at the total internal reflection surfaces step by step and is chopped into a specific number of parts which have the same width as that of the exit aperture from which they emerge stacked one on top of another. Three embodiments, according to the types of prism assemblies and entrance and exit apertures, are presented.

1 Claim, 3 Drawing Sheets

METHOD AND APPARATUS FOR STACKING BEAMS

CROSS REFERENCES TO CO-PENDING APPLICATIONS

None.

BACKGROUND OF THE INVENTION

1. Field of the Invention

This invention relates to beam shaping, and, more particularly, to beam stacking devices and methods for stacking beams which change the shape of a beam from a highly asymmetric non-diffraction-limited laser source, such as a high power laser diode bar, to a more symmetric, and thus more desirable and useful, profile.

2. Description of the Prior Art

While semiconductor lasers are widely used in both scientific and consumer devices, the relatively low power output of such devices has limited their use. The output power of semiconductor lasers has been increased by several different techniques, one being fabricating a multiple diode device in the form of an array of low power laser diodes on a single chip. While it is possible to fabricate such a multiple diode device having, for example, 10 laser diodes, the output of such a device is a beam having a highly elliptical shape or profile. That is, the output beam is much wider in the dimension corresponding to the necessary spacing between the laser diodes than in the dimension corresponding to the width of a single laser diode. In other words, the output beam has dramatically unequal $M^2$ dimensions in two orthogonal directions, thus resulting in a beam which is highly asymmetrical.

High power laser diode bars are attractive as optical sources for applications in pumping solid state lasers, in materials processing, and in the medical field. Unfortunately, the inconvenient shape, i.e., highly elliptical nature, of the output beam of laser diode bars makes them, by themselves, inappropriate for many of the uses which require a higher power output than is attainable from a single laser diode source. However, this has not been a fatal shortcoming because there exist techniques for reconfiguring the shape or profile of the output beam to make it less elliptical in nature; that is, to create an output beam whose dimensions in two orthogonal directions are more nearly equal, thus giving rise to an output beam which is substantially symmetrical. One such technique is the beam stacking device disclosed in European patent number EP0731932 and in corresponding International Application (PCT) number WO 95/15510, and it is that sort of technique which the present invention serves to improve.

The beam stacking device of European patent number EP0731932 and International Application number WO 95/15510 consists of two high reflectivity planar mirrors aligned approximately parallel and separated by a small distance. The two mirrors are offset transversely from each other in two directions so that small sections of each mirror are not obscured by the other. These unobscured sections form input and output apertures of the beam stacking device. The action of the beam stacking device is to chop the incident beam into a specific number of chopped parts and then to redirect and reposition these chopped parts so that they emerge from the beam stacking device one on top of another. Although this beam stacking device does reconfigure the output beam to a more favorable profile, it nevertheless has several disadvantages, the principal disadvantage being that, because the incident beam is chopped many times and many reflections are needed between the mirrors, losses due to reflection are great and, therefore, the transmission is low.

SUMMARY OF THE INVENTION

The general purpose of the present invention is to provide new beam stacking devices and methods of beam stacking which overcome the disadvantages of the prior art. This is achieved through the use of a prism assembly including entrance and exit apertures and total internal reflection surfaces.

More particularly, the beam stacking devices of this invention utilize a prism assembly into which an elliptical incident beam to be shaped, i.e., an incident beam effectively having greatly different $M^2$ parameters in two directions, is introduced through an entrance aperture and then sequentially reflected by four total internal reflection surfaces of the prism assembly such that on each round trip a chopped part of the beam emerges from an exit aperture and is stacked on top of the preceding chopped part. The lengths of the four total internal reflection surfaces provide for inward displacement of adjacent parts of the input beam incident on the entrance aperture, thereby compressing the input beam in one orthogonal direction. The width of the exit aperture provides the dimension of the emergent beam along the other orthogonal direction and is selected so that the input beam is expanded in the other orthogonal direction. Consequently, in comparison with the input beam at the entrance aperture, the output or emergent beam at the exit aperture has a reduced orthogonal dimension in one orthogonal direction and an increased orthogonal dimension in the other orthogonal direction. Stated in another manner, the effect of the beam stacking device is to decrease the size of the highly elliptical input beam along one orthogonal direction and to increase the size of the highly elliptical input beam along the other orthogonal direction, thereby reconfiguring the highly asymmetrical input beam into an output beam which is substantially symmetrical. Since the first round trip of the incident beam involves four total internal reflections, and each succeeding round trip involves another four additional reflections, the losses due to reflection are minimized. For example, in accordance with each of two embodiments of the invention, an elliptical incident beam comprising the output of a five laser diode bar can be combined to produce a single, more favorably shaped output beam with a total of only 55 internal reflections and, in another embodiment of the invention, with a total of only 60 internal reflections.

In one embodiment, a beam stacking device is formed of a prism assembly consisting of a right angle prism which provides the entrance aperture, and a rectangular parallelepiped prism with one edge cut away which provides the four total internal reflection surfaces and the exit aperture.

In a second embodiment, a beam stacking device is formed that includes two right angle prisms. One right angle prism provides the entrance aperture and two of the four total internal reflection surfaces. The other right angle prism, which has a portion cut away for the path of the entrance, provides the exit aperture and the other two of the four total internal reflection surfaces.

In a third embodiment, a beam stacking device consists of two prisms. One prism provides the entrance aperture and two of the four total internal reflection surfaces. The other prism provides the exit aperture, the other two of the four total internal reflection surfaces, and the path of the entrance.

In all of the embodiments the beam stacking devices permit focusing beams to small diameters, i.e., more nearly equal orthogonal dimensions, without significantly decreasing the brightness. The total internal reflection surfaces improve the quality of the transmission. The number of stacked beams is a function of the incident beam width and the size of the exit aperture. The shift of stacking beams in one direction is implemented by the size difference of the total internal reflection surfaces.

The entrance and exit apertures of the various embodiments can be switched, and can be implemented by cut away surfaces or by additional components such as right angle prisms.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1A:
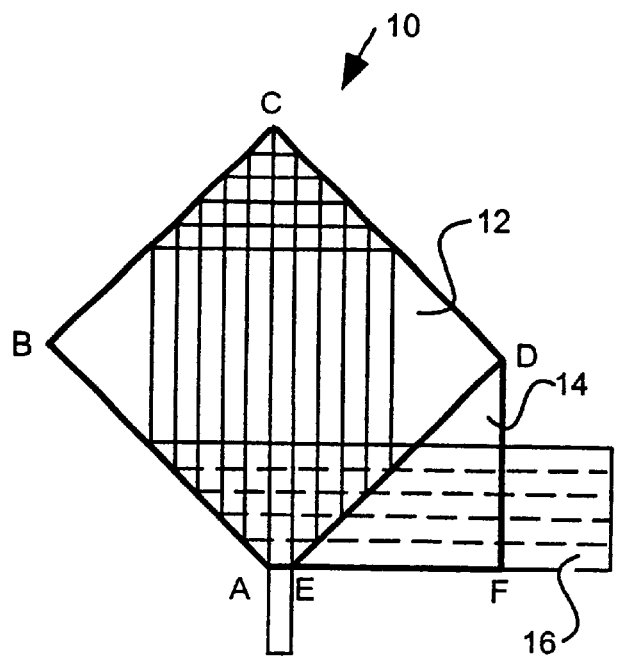
FIGS. 1a and 1b show, respectively, plan and elevation schematic views of the first preferred embodiment.

As shown in FIG. 1a, the beam stacking device 10 of this invention includes a prism assembly of two elements: a prism 12 in the form of a rectangular parallelepiped with one lateral edge cut away, thus forming a prism having pentagonal bases and five lateral faces or surfaces; and a right angle prism 14. The lateral edges of prism 12 are identified by the letters A, B, C, D and E; and the lateral edges of prism 14 are identified by the letters D, E and F. For convenience herein, whenever referring to a particular lateral surface, such will be identified simply by specifying the two lateral edges which are the boundaries thereof. For example, the lateral surface bounded by lateral edges A and B is termed "surface AB". Thus, relying on this convention and continuing with the description, the surface DF of prism 14 serves as an entrance aperture, and the surface AE of prism 12 serves as an exit aperture. The dihedral angles ∠ABC, ∠BCD and ∠CDE are 90 degrees. The dihedral angles ∠DEA and ∠EAB are 135 degrees. The dihedral angles ∠EDF and ∠FED are 45 degrees. The length AB is equal to the length BC. The length CD is equal to AB+(1/√2)AE, and the length DE is equal to AB−(1/√2)AE. The prisms 12 and 14 are made of, for example, the well known optical glass designated in the Schott optical glass catalog as BK7. In use, a beam 16 enters the entrance aperture at surface DF and proceeds to surface AB. The angle of incidence of the beam 16 at the surface AB is 45 degrees, which is larger than that of the total internal reflection at the interested wavelength. Total internal reflection of the beam 16 first occurs at the surface AB. Total internal reflection also occurs at the surfaces BC, CD and DE. When the beam 16 undergoes total internal reflection at the surface CD for the first time, a first chopped part 16a emerges from the exit aperture AE while the remaining portion directs to the surface DE and thence to the surface AB a second time. The width of the chopped part is equal to the width of the exit aperture AE. After the second round trip, the second chopped part 16b emerges from the exit aperture AE, but displaced beneath the first chopped part 16a. For the purpose of illustration, the number of chopped parts is chosen to be five chopped parts 16a, 16b, 16c, 16d and 16e.

Figure 1B:
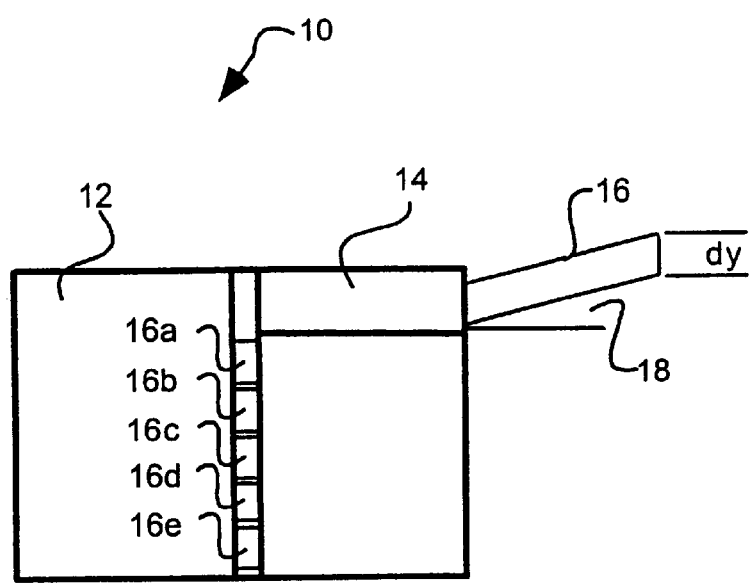

As shown in the orthogonal view in FIG. 1b, chopped part 16a is sequentially reflected at surfaces AB, BC and CD and then emerges from exit aperture AE, but displaced beneath beam 16 due to the angle of incidence 18. Chopped part 16b is sequentially reflected at surfaces AB, BC, CD and DE for two round trips and then emerges from exit aperture AE, but displaced beneath chopped part 16a due to the angle of incidence. Chopped parts 16c, 16d and 16e undergo similar multiple round trip reflections at surfaces AB, BC, CD and DE until they finally emerge from exit aperture AE beneath chopped parts 16b, 16c and 16d. Thus, the action of the beam stacking device 10 is effectively to chop the incident beam 16 into a specific number of chopped parts and then to redirect and reposition those chopped parts so that they emerge from the beam stacking device stacked one on top of another with a reduced orthogonal dimension corresponding to the direction of stacking and with an increased orthogonal dimension corresponding to the width of the exit aperture, thereby resulting in an output beam which is substantially symmetrical.

For many applications, it is desirable to minimize the gap between adjacent chopped parts by choosing the angle of incidence 18 in accordance with the equation, $$\sin 2\theta / \sqrt{n^2 - \sin^2\theta} \geq dy / \sqrt{2}AB$$

where $\theta$ is the angle of incidence 18, n is the index of BK7 at the interested wavelength, and dy is the incident beam size in one direction.

Figure 2A:
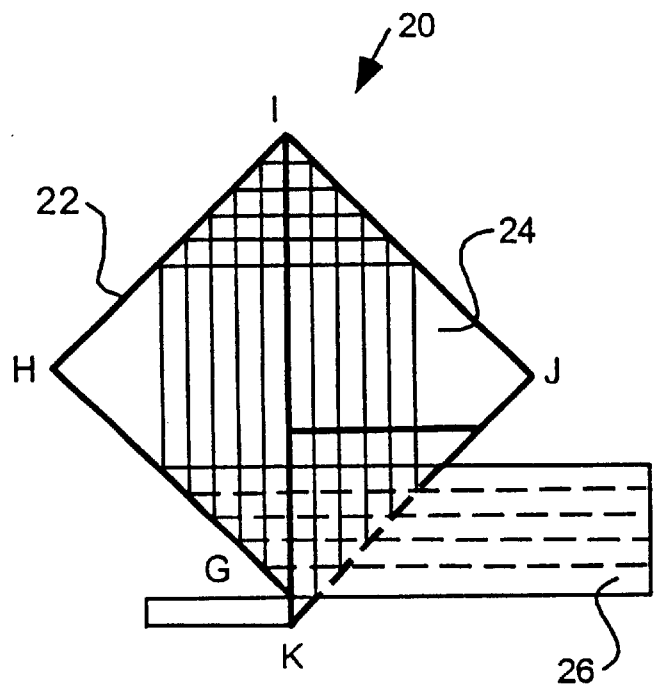
FIGS. 2a and 2b show, respectively, plan and elevation schematic views of the second preferred embodiment; and, FIGS. 3a and 3b show, respectively, plan and elevation schematic views of the third preferred embodiment.

Two alternate embodiments are illustrated in FIGS. 2a,2b and 3a,3b. FIG. 2a shows a beam stacking device 20 of the invention which includes a prism assembly of two elements: a small prism 22 and a larger prism 24. The lateral edges of prism 22 are identified by the letters G, H and I; and the lateral edges of the prism 24 are identified by the letters I, J and K. The surfaces GI and GK serve as entrance and exit apertures, respectively. A portion of the prism 24 is cut away to provide the path for the incident beam 26. The dihedral angles ∠GHI, ∠HIJ and ∠IJK are 90 degrees. The dihedral angles ∠IGH, ∠HIG, ∠IKJ and ∠KIJ are 45 degrees. The dihedral angle ∠HGK is 135 degrees. The length GH is equal to the length HI. The length IJ is the same as the length JK, both being equal to GH+(1/√2)GK. The prisms 22 and 24 are made of, for example, BK7. The angle of incidence of the beam 26 at the surface GH is 45 degrees, which is larger than that of the total internal reflection at the interested wavelength. Total internal reflection of the beam 26 first occurs at the surface GH. Total internal reflection of the beam 26 also occurs at the surfaces HI, IJ and JK. When the beam 26 undergoes total internal reflection at the surface JK for the first time, a first chopped part 26a emerges from the exit aperture GK while the remaining portion directs to the surface GH a second time. The width of the chopped part is equal to the width of the exit aperture GK. After the second round trip, the second chopped part 26b emerges from the exit aperture GK, but displaced beneath the first chopped part 26a. This process continues until the entire incident beam is reconfigured. For the purpose of illustration, the number of chopped parts is chosen to be five chopped parts 26a, 26b, 26c, 26d and 26e.

Figure 2B:
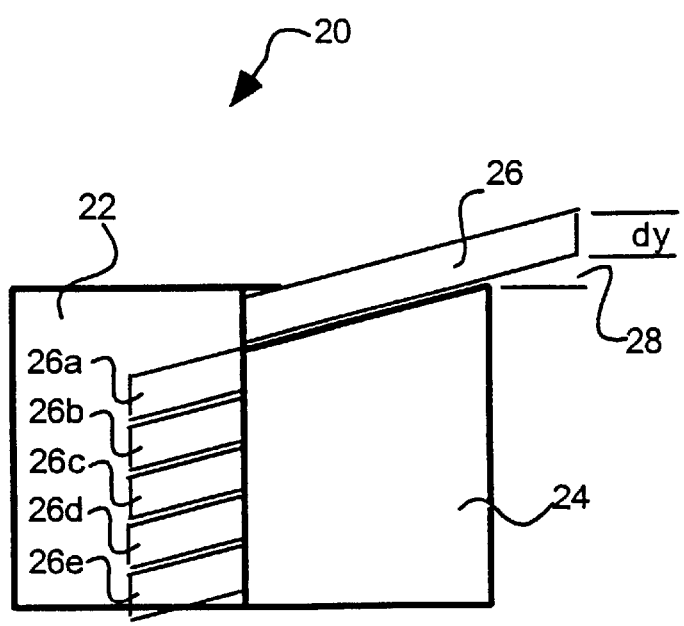

As shown in the orthogonal view in FIG. 2b, chopped part 26a is sequentially reflected at surfaces GH, HI, IJ and JK and then emerges from exit aperture GK, but displaced beneath beam 26 due to the angle of incidence 28. Chopped part 26b is sequentially reflected at surfaces GH, HI, IJ and JK for two round trips and then emerges from exit aperture GK, but displaced beneath chopped part 26a due to the angle of incidence. Chopped parts 26c, 26d and 26e undergo similar multiple round trip reflections at surfaces GH, HI, IJ and JK until they finally emerge from exit aperture GK beneath parts 26b, 26c and 26d. Thus, as with the beam stacking device 10, the action of the beam stacking device 20 is effectively to chop the incident beam 26 into a specific number of chopped parts and then to redirect and reposition those chopped parts so that they emerge from the beam stacking device stacked one on top of another, thereby attaining a beam with improved orthogonal dimensions which enable its use in applications incapable of the original unmodified beam.

Figure 3A:
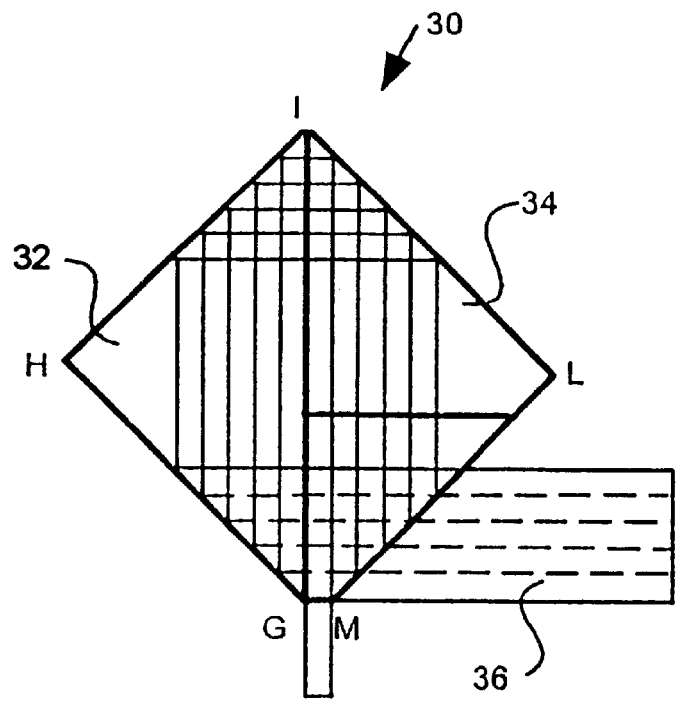
Figure 3B:
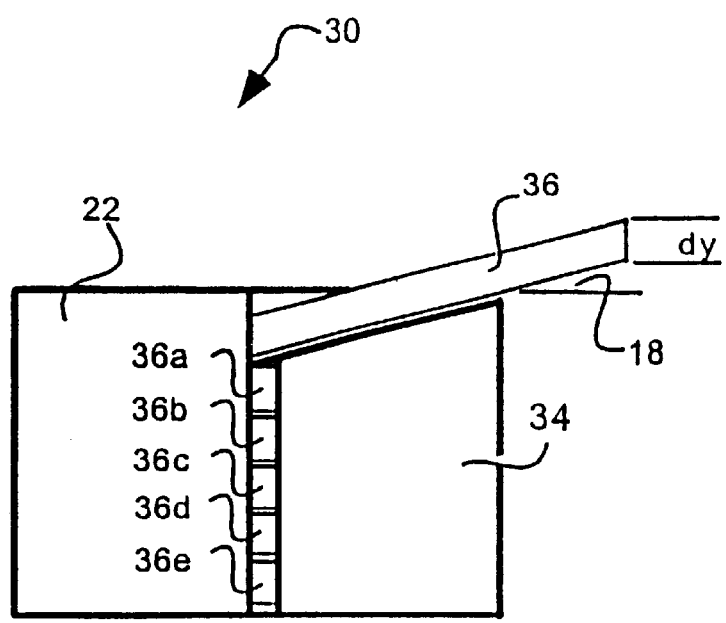

FIGS. 3a and 3b show another alternate embodiment of a beam stacking device in accordance with the invention. Illustrated in these figures is a beam stacking device 30 which includes a prism assembly of two elements: a small prism 32 and a larger prism 34. The lateral edges of prism 32 are identified by the letters G, H and I; and the lateral edges of the prism 34 are identified by the letters I, L, M and G. The surfaces GI and GM serve as entrance and exit apertures, respectively. A portion of the prism 34 is cut away to provide the path for the incident beam 36. The dihedral angles $\angle$GHI, $\angle$HIL and $\angle$ILM are 90 degrees. The dihedral angles $\angle$IGH, $\angle$HIG and $\angle$GIL are 45 degrees. The dihedral angles $\angle$LMG and $\angle$MGH are 135 degrees. The length GH is equal to the length HI. The length IL is equal to GH+(1/$\sqrt{2}$)GM, and the length LM is equal to GH−(1/$\sqrt{2}$)GM. The prisms 32 and 34 are made of, for example, BK7. The angle of incidence of the beam 36 at the surface GH is 45 degrees, which is larger than that of the total internal reflection at the interested wavelength. Total internal reflection of the beam 36 first occurs at the surface GH. Total internal reflection of the beam 36 also occurs at the surfaces HI, IL and LM. When the beam 36 undergoes total internal reflection at the surface IL for the first time, a first chopped part 36a having a width equal to the width of the exit aperture GM emerges from the exit aperture GM while the remaining portion of the beam 36 directs to the surface LM and then undergoes a second round trip of sequential reflections at surfaces GH, HI and IL. Upon undergoing total internal reflection a second time at surface IL, a second chopped part 36b emerges from the exit aperture GM, but displaced beneath the first chopped part 36a. As this process continues, the beam 36 is chopped into further parts which emerge from the exit aperture GM stacked on top of one another. For the purpose of illustration, the number of chopped parts is chosen to be five chopped parts 36a, 36b, 36c, 36d and 36e.

MODE OF OPERATION

In all three embodiments of the invention, the incident beam to be reconfigured passes through an entrance aperture of a prism assembly, undergoes total internal reflection at four total internal reflection surfaces of the prism assembly step by step, and is chopped into a number of parts which emerge from an exit aperture of the prism assembly. The emerged chopped parts are stacked on top of one another due to the angle of incidence of the beam and the size difference of the four total internal reflection surfaces. The result is a reconfigured beam which has a more favorable profile in two orthogonal directions, thus rendering it suitable for use as an attractive and viable optical source in a variety of applications.

Various modifications can be made to the present invention without departing from the apparent scope hereof.

It is claimed:

1. A beam stacking device comprising:
   a. a prism assembly having four total internal reflection surfaces;
   b. adjacent ones of said total internal reflection surfaces being at right angles to each other;
   c. said prism assembly further including an entrance aperture and an exit aperture; and,
   d. the lengths of said total internal reflection surfaces providing for displacement of adjacent portions of a beam incident on said entrance aperture inwardly, whereby said beam is compressed in one direction to provide an emergent beam at said exit aperture having a reduced dimension along said one direction.

* * * * *